United States Patent
Lee

(10) Patent No.: US 9,257,553 B2
(45) Date of Patent: Feb. 9, 2016

(54) VERTICAL TRANSISTOR AND METHOD TO FORM VERTICAL TRANSISTOR CONTACT NODE

(71) Applicant: INOTERA MEMORIES, INC., Taoyuan (TW)

(72) Inventor: Tzung-Han Lee, Taipei (TW)

(73) Assignee: INOTERA MEMORIES, INC., Hwa-Ya Technology Park Kueishan, Taoyuan (TW)

(*) Notice: Subject to any disclaimer, the term of this patent is extended or adjusted under 35 U.S.C. 154(b) by 0 days.

(21) Appl. No.: 14/504,385

(22) Filed: Oct. 1, 2014

(65) Prior Publication Data

US 2015/0349118 A1 Dec. 3, 2015

(30) Foreign Application Priority Data

May 27, 2014 (TW) .............................. 103118454 A

(51) Int. Cl.
*H01L 29/78* (2006.01)
*H01L 29/66* (2006.01)

(52) U.S. Cl.
CPC .......... *H01L 29/7827* (2013.01); *H01L 29/665* (2013.01); *H01L 29/66553* (2013.01); *H01L 29/66666* (2013.01)

(58) Field of Classification Search
CPC ..................... H01L 27/10876; H01L 29/7827; H01L 29/66666; H01L 21/266; H01L 27/0207; H01L 21/823487; H01L 27/10844; H01L 21/31144; H01L 21/823885
See application file for complete search history.

(56) References Cited

U.S. PATENT DOCUMENTS

| | | | |
|---|---|---|---|
| 4,923,822 A * | 5/1990 | Wang et al. | 438/297 |
| 5,032,882 A * | 7/1991 | Okumura et al. | 257/302 |
| 5,045,916 A * | 9/1991 | Vor et al. | 257/383 |
| 5,313,089 A * | 5/1994 | Jones, Jr. | 257/295 |
| 5,937,296 A * | 8/1999 | Arnold | 438/270 |
| 6,143,635 A * | 11/2000 | Boyd et al. | 438/585 |
| 6,238,988 B1 | 5/2001 | Hsiao | |
| 6,548,344 B1 | 4/2003 | Beintner | |
| 7,015,092 B2 | 3/2006 | Jaiprakash | |
| 7,842,999 B2 * | 11/2010 | Takaishi | 257/328 |
| 8,896,059 B1 * | 11/2014 | Kim | 257/331 |
| 2005/0186746 A1 * | 8/2005 | Lee et al. | 438/300 |
| 2007/0075359 A1 * | 4/2007 | Yoon et al. | 257/329 |
| 2007/0295995 A1 * | 12/2007 | Yun et al. | 257/202 |
| 2011/0086490 A1 * | 4/2011 | Wang et al. | 438/396 |
| 2012/0007171 A1 * | 1/2012 | Kim et al. | 257/330 |
| 2012/0012926 A1 * | 1/2012 | Ha et al. | 257/330 |
| 2013/0153848 A1 | 6/2013 | Park | |

* cited by examiner

*Primary Examiner* — Evan Pert
*Assistant Examiner* — Gustavo Ramallo
(74) *Attorney, Agent, or Firm* — Winston Hsu; Scott Margo

(57) ABSTRACT

A vertical transistor structure includes a substrate with a protruding structure, an offset layer covering a top surface of the protruding structure, a conductive layer disposed on the offset layer, and an interlayer disposed between the offset layer and the conductive layer to serve as a contact node.

19 Claims, 21 Drawing Sheets

VERTICAL TRANSISTOR AND METHOD TO FORM VERTICAL TRANSISTOR CONTACT NODE

CROSS REFERENCE TO RELATED APPLICATION

This application claims the benefit of Taiwan patent application No. 103118454, filed on May 27, 2014, the disclosure of which is incorporated herein in its entirety by reference.

BACKGROUND OF THE INVENTION

1. Field of the Invention

The present invention generally relates to a vertical transistor structure and a method of forming a contact node of the vertical transistor structure. In particular, the present invention for forming a composite contact node in the vertical transistor structure, whereby the outward contact resistance of the vertical transistor structure can be reduced.

2. Description of the Prior Art

Dynamic random access memory (DRAM) is a semiconductor element wherein a capacitor structure is electrically connected to a gate structure. The storage capacitor is the core elements of the dynamic random access memory, which is responsible for storing the signal or data. Depending on the position of the storage capacitor, the dynamic random access memory can be divided into trench type and stacked capacitor structures. When considering the manufacturing capacity, the physical limit of the material, leakage current, precision and exposure and etching processes, the stacked capacitor structure has advantage over the trench capacitor.

A trench capacitor is usually located under the gate electrode, and stacked capacitor structure is located above the gate electrode, so manufacturing steps for the stacked capacitor structure will fall after the gate electrode structure fabrication steps. Therefore, the gate structure at the time of manufacture, it will leave an upward node, to be connected with the stacked capacitor structure. Thus, when a stack capacitor structure is completed, contact node for electrically connecting the capacitor and the gate structure is formed.

However, the current process simply uses silicon as a material for the node, so the contact node does not have an ideal low contact resistance (outward contact resistance), which has become one obstacle to the performance improvement of the dynamic random access memory.

SUMMARY OF THE INVENTION

The present invention, therefore, discloses a vertical transistor structure and a method for forming contact node of the vertical transistor structure. In order to solve the problem of contact resistance when simply using silicon as a electrical contact node, the present invention particularly proposes a composite contact node in the vertical transistor structure, which can reduce the outward contact resistance of the gate structure in the vertical transistor structure.

In one aspect, the present invention discloses a vertical transistor structure, comprising a substrate having a protruding structure; an offset layer covering a top surface of the protruding structure; and an interlayer on the offset layer, wherein the interlayer comprises a composite conductive layer formed from the offset layer. In particular, the interlayer acts as a contact node in the vertical transistor structure.

In one embodiment, the substrate is a doped silicon substrate.

In another embodiment, the protruding structure is a cubic shaped structure.

In another embodiment, the protruding structure is an island-like pillar.

In another embodiment, the offset layer is a deposited silicon layer.

In another embodiment, the vertical transistor structure further comprises a conductive layer atop the offset layer, wherein the conductive layer comprises tungsten or titanium.

In another embodiment, the composite conductive layer is a metal silicide between the offset layer and the conductive layer.

In another embodiment, the composite conductive layer comprises tungsten silicide.

In another embodiment, the interlayer comprises a conductive material layer.

In another embodiment, the conductive material layer comprises tungsten or titanium, wherein the composite conductive layer is a metal silicide between the offset layer and the conductive layer.

In one aspect, the present invention discloses a method for fabricating a contact node of a vertical transistor, including the steps of:

providing a stack material layer comprising a hard mask layer, an offset layer, and a conductive layer;

patterning the hard mask layer to form an etch hard mask;

etching the stack material layer not covered by the etch hard mask to form a protruding structure; and subjecting the stack material layer to an annealing process thereby forming an interlayer comprising a composite conductive layer.

In one embodiment, the stack material layer comprises, in the order of, the hard mask layer, the conductive layer, and the offset layer, wherein the offset layer and the conductive layer react together to form the composite conductive layer.

In another embodiment, the stack material layer further comprises a substrate and a conductive material layer, wherein the offset layer covers the substrate, and wherein the offset layer and the conductive layer react together to form the composite conductive layer.

In another embodiment, the offset layer is a deposited silicon layer.

In another embodiment, the conductive layer comprises tungsten or titanium.

In another embodiment, the composite conductive layer is a metal silicide layer.

In another embodiment, the interlayer further comprises a conductive material layer.

In another embodiment, the conductive material layer comprises tungsten or titanium.

In another embodiment, the method further comprising:
performing an oxidation process to form a gate oxide layer on surfaces of the protruding structure.

In another embodiment, the method further comprising:
forming a spacer on surfaces of the protruding structure.

In another embodiment, the method further comprising:
forming a dielectric layer to cover the protruding structure; and partially removing the dielectric layer, and removing the conductive layer without exposing underlying said interlayer.

Since the present invention uses annealing process, the laminated material layer includes the interlayer comprising the composite conductive layer, and able to provide contact node with stable physical and chemical properties and low contact resistance, so as to improve the performance of dynamic random access memory.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a vertical transistor structure having a composite contact node and a method for forming such composite contact node in the vertical transistor structure. To address the problem of unsatisfactory contact resistance because only silicon material is typically used as an electrical contact node, the present invention provides a composite contact node in the vertical transistor structure. The proposed composite contact node can reduce the outward contact resistance of a gate structure of the vertical transistor structure. Further, the conductive material used in the composite contact node can help to form a landing pad with the lower electrode of the other elements.

Figure 3:
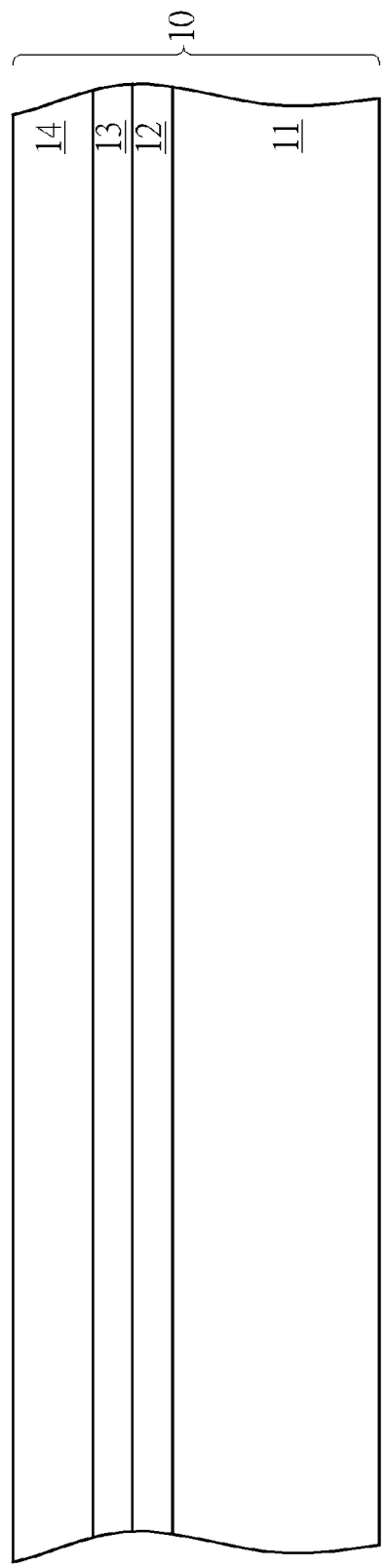
Figure 4:
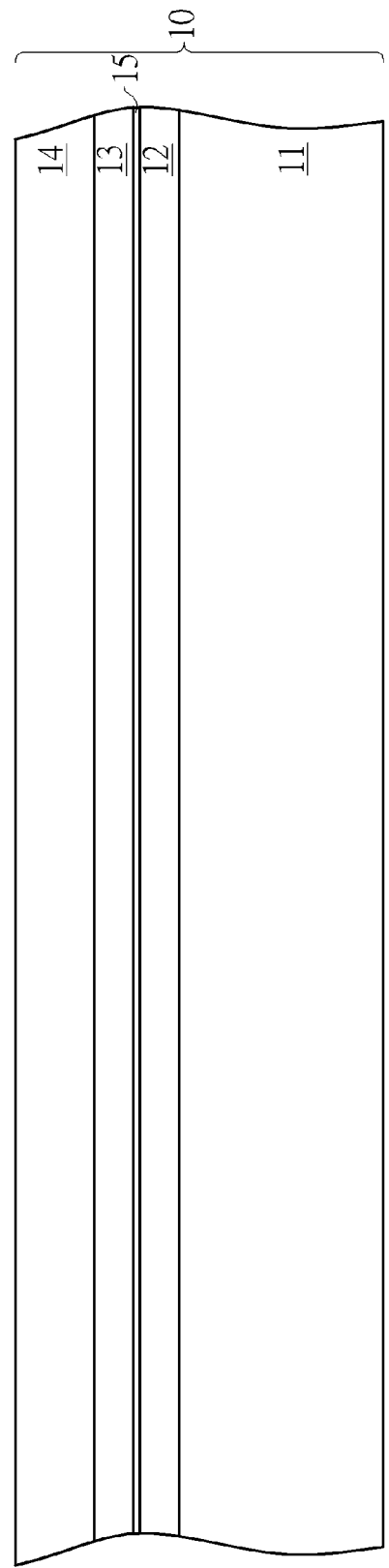

According to one aspect of the present invention, a method for forming a contact node of a vertical transistor structure is provided. Referring to FIG. 3, a laminated material layer 10 is prepared. The laminated material layer 10 comprises a substrate 11, a buffer layer (offset layer) 12, a conductive layer 13, and a hard mask layer 14. As necessary, referring to FIG. 4, in addition to the substrate 11, the buffer layer 12, the conductive layer 13 and the hard mask layer 14, the laminated material layer 10 may also comprise a conductive material layer 15, and the buffer layer 12 still directly covers the substrate 11. In FIG. 3 or FIG. 4, with or without a conductive material layer 15 in the laminated material layer 10, the hard mask layer 14 will be the topmost layer.

Figure 1:
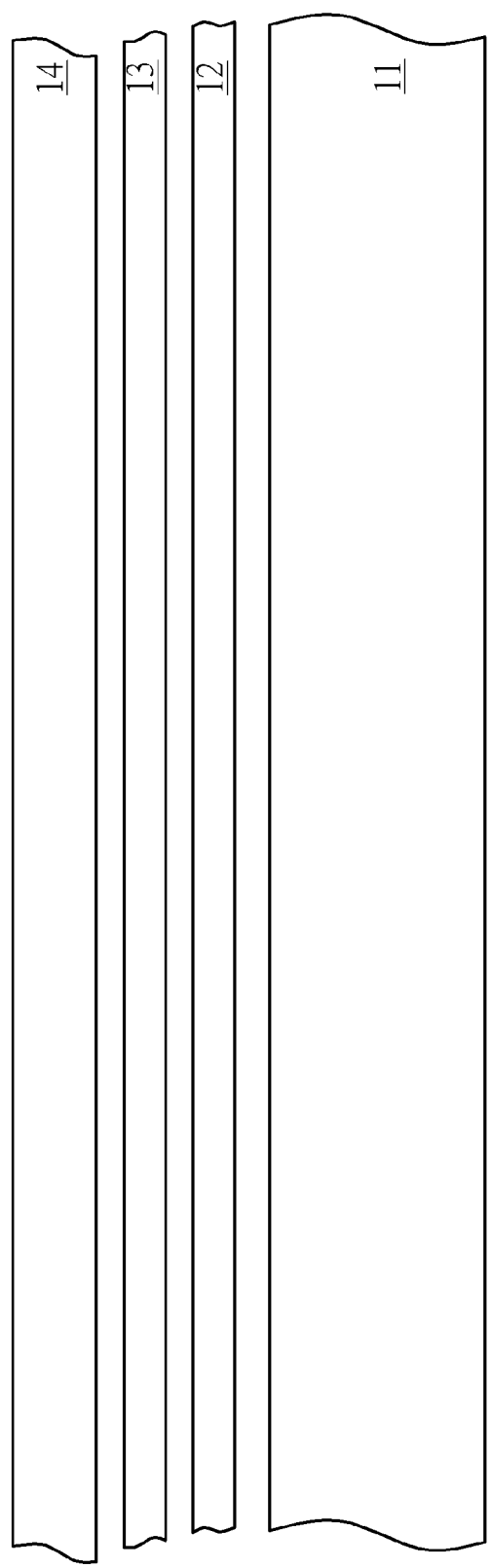
FIG. 1 to FIG. 10, FIG. 5A to FIG. 10A, and FIG. 9B illustrate a preferred process for forming the vertical transistor structure according to the invention.
Figure 2:
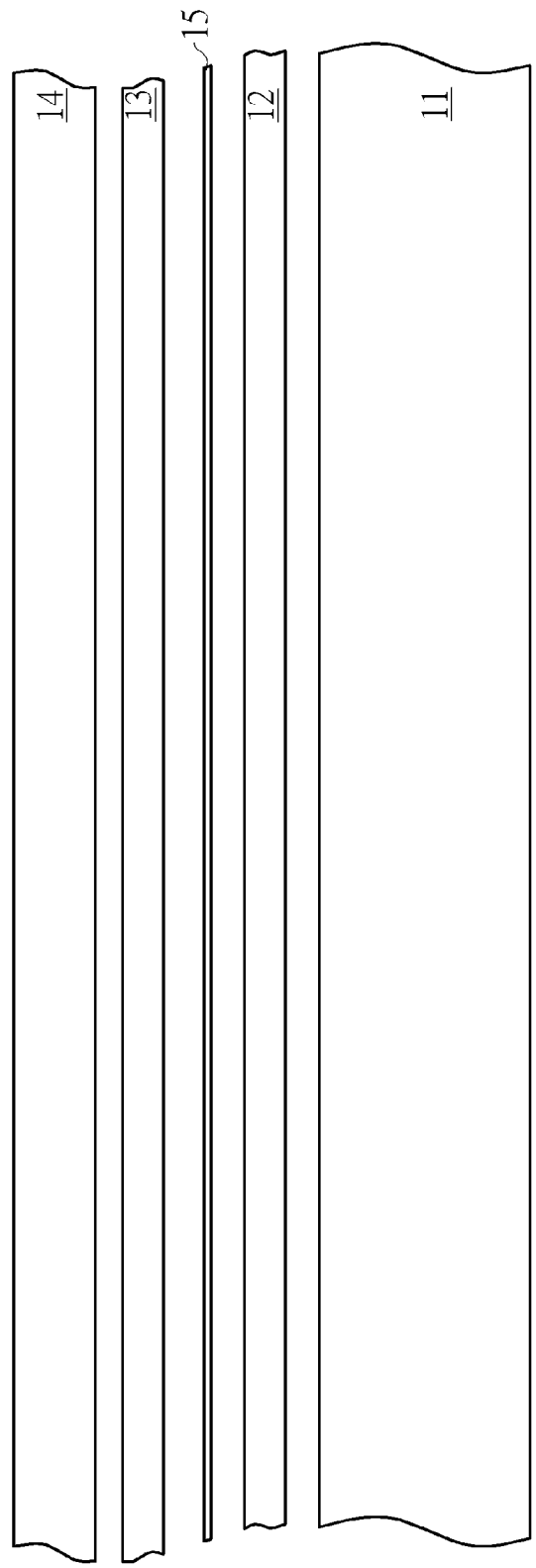

The process for forming the aforesaid laminated material layer is shown in FIG. 1 or FIG. 2. The substrate 11 may be subjected to, for example, sputtering or deposition process, to sequentially form thereon the buffer layer 12, the conductive layer 13, conductive material layer 15 as necessary, and the hard mask layer 14.

The substrate 11 is typically a semiconductor material such as silicon. Depending on the design requirements, typically, the substrate 11 is appropriately doped with, for example, P-type or N-type dopants. The buffer layer 12 may be a semiconductor material such as deposited silicon layer (deposited Si), which is located on the substrate 11. The buffer layer 12 is used as a buffer between the substrate 11 and the adjacent conductive layer 13 or the conductive material layer 15 as necessary. The conductive layer 13 is typically a metallic material, preferably those capable of forming a metal silicide with silicon to have stable physical and chemical properties and low resistance, such as tungsten or titanium. The conductive material layer 15 as required may be of another metal materials, preferably those capable of forming a metal silicide with silicon to have stable physical and chemical properties and low resistance, such as tungsten or titanium. It noteworthy that the conductive layer 13 and the conductive material layer 15 are mutually different. The hard mask layer 14 may be a patternable material such as silicon nitride.

Figure 5:
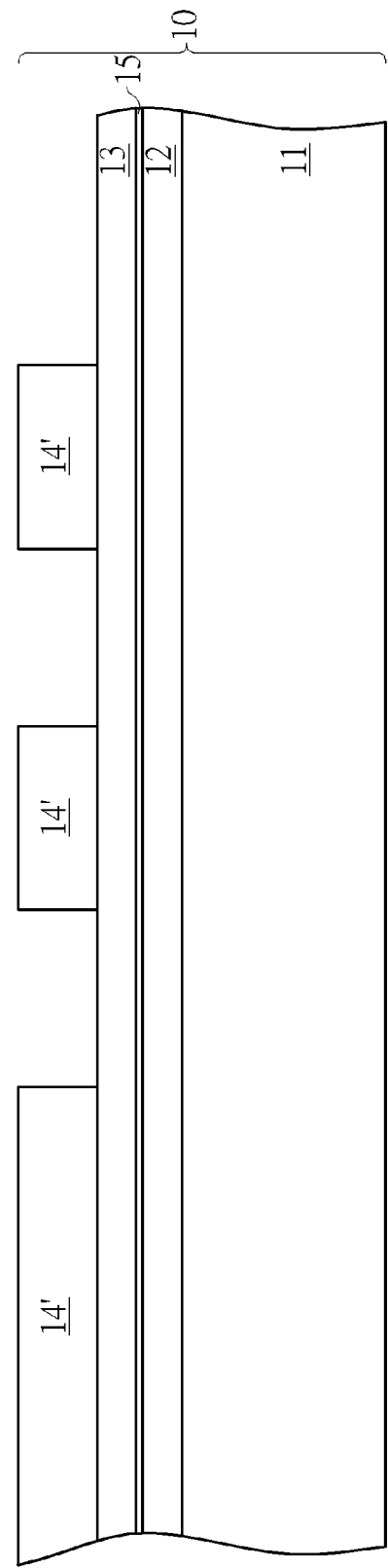
Figure 5A:
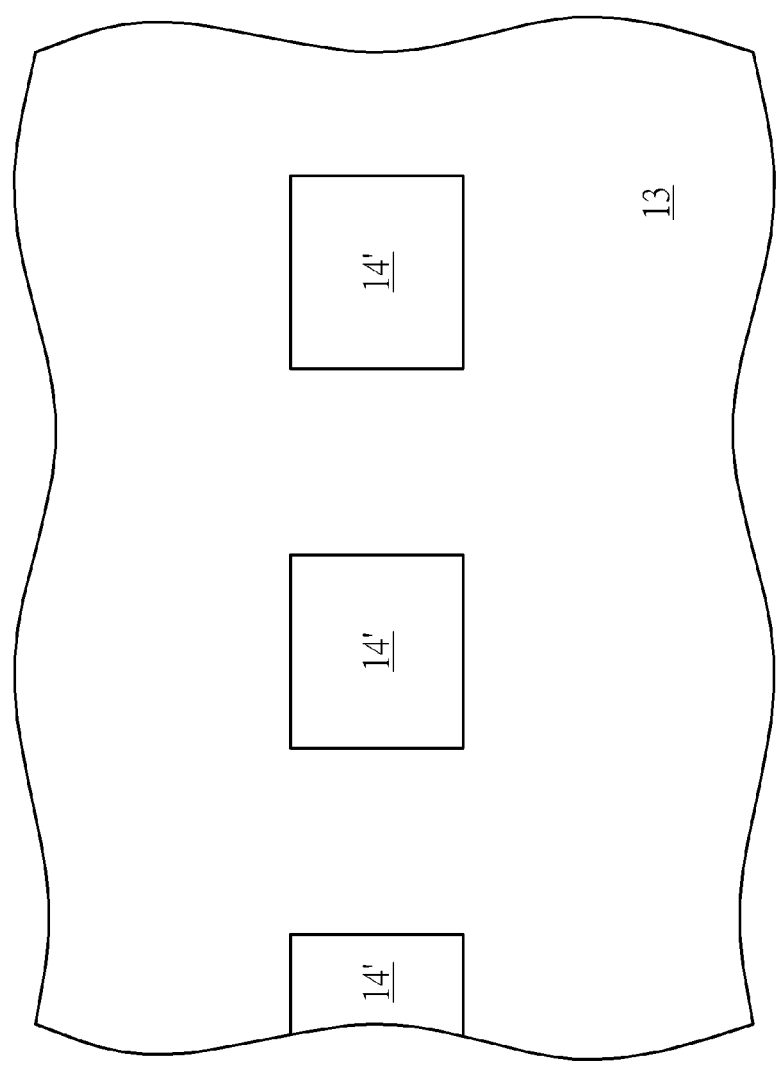

Please refer to FIG. 5, the hard mask layer 14 is patterned to form an etch mask layer 14'. The etch mask layer 14' is used as vertical gate post (not shown) when a vertical transistor structure (not shown) is subsequently defined and constructed. The step of patterning the hard mask layer 14 may involve the use of photoresist materials (not shown) in combination with the conventional lithography, etching and other procedures to thereby form the etch mask layer 14'. FIG. 5A is a top view of FIG. 5, which includes the conductive material layer 15. As shown in FIG. 5A, the etch mask layer 14' each has rectangular pattern and is not connected to an adjacent etch mask layer 14'.

Figure 6:
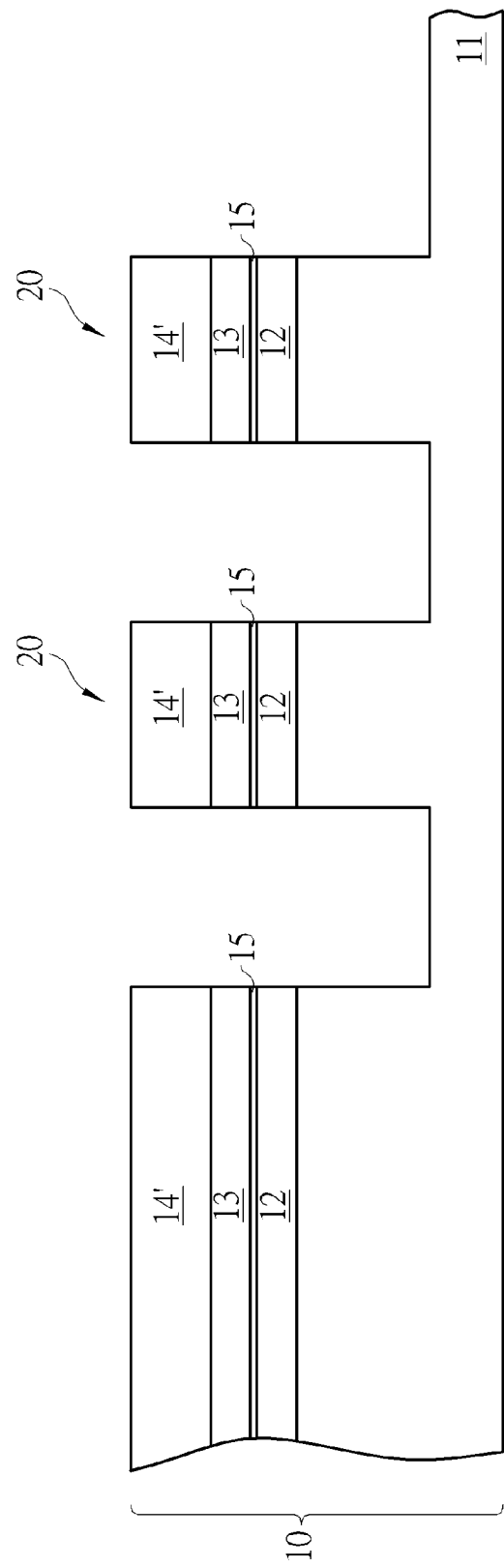
Figure 6A:
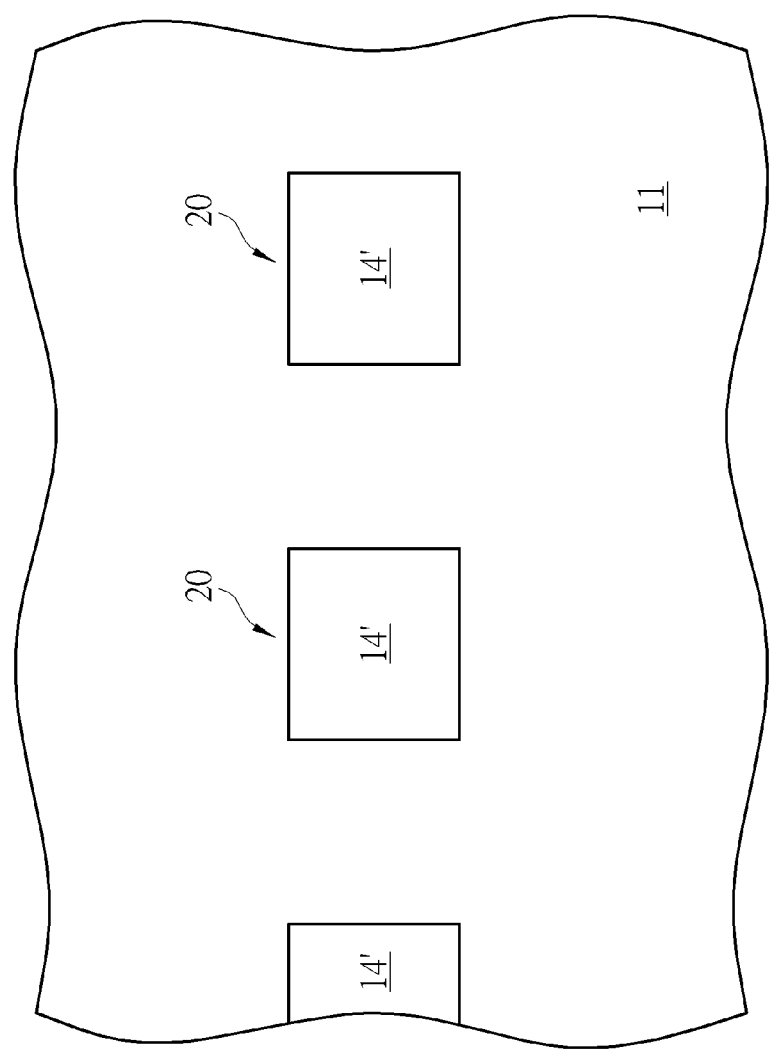

Referring to FIG. 6, using the etching mask layer 14' and suitable etchant, the laminated material layer 10 is etched. The material layers in the laminated material layer 10, such as the conductive material layer 15 as required, the conductive layer 13, the buffer layer 12 and the substrate 11, may be etched with one-step etch or multi-step etch process. Mixed formulations or etch recipes may be used to etch the laminated material layer 10 to form protruding structures 20. Preferably, over-etching the substrate 11 may be implemented such that the lower part of the protruding structures 20 is exposed within the substrate 11. By adjusting the depth when over etching the substrate 11, a desired height of the vertical transistor structure may be achieved. FIG. 6A is a top view of FIG. 6, which includes the conductive material layer 15. Each protruding structure 20 is capped by etch mask layer 14' and is a cubic shaped structure, for example, an isolated island-like pillar. The protruding structures 20 are not physically connected to one another.

Figure 7:
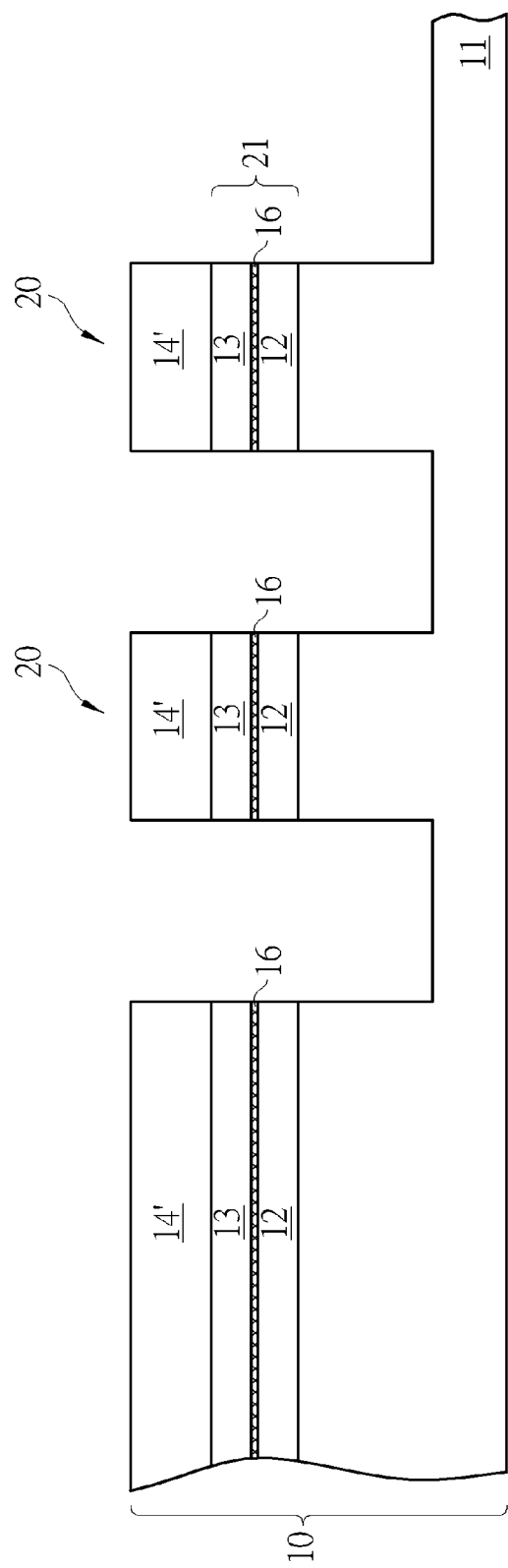
Figure 7A:
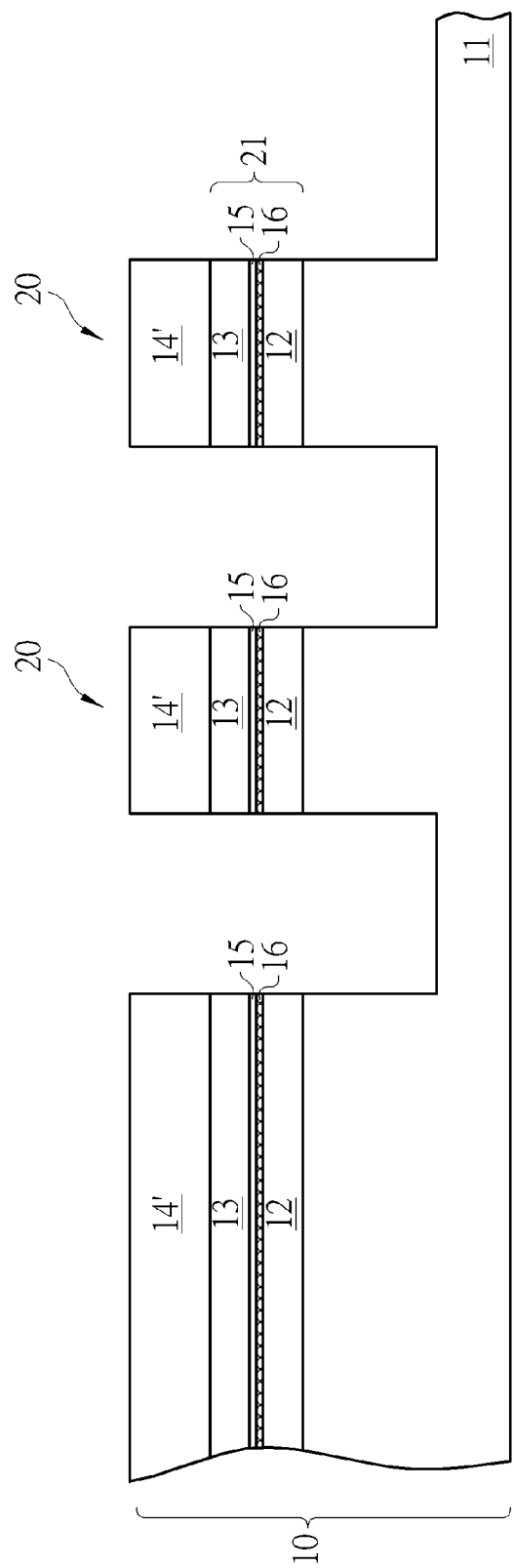

As shown in FIG. 7 and FIG. 7A, the protruding structures 20 formed in the laminated material layer 10 are subjected to annealing treatment. By performing the annealing treatment, reaction may occur at the interface between the buffer layer 12 and the conductive layer 13, or at the interface between the buffer layer 12 and the conductive material layer 15, thereby forming a new material layer. The new material layer interposed between the buffer layer 12 and the conductive layer 13 is referred to as interlayer 21. The aforesaid annealing process may be carried out at 600° C. to 1200° C. in a furnace or rapid thermal processing apparatus.

For example, referring to FIG. 7, in a case that the conductive material layer is not required, the buffer layer 12 reacts with the conductive layer 13 to form the composite conductive layer 16. As shown in FIG. 7A, in a case that the conductive material layer is required, the buffer layer 12 reacts with the conductive material layer 15 to form the composite conductive layer 16. It depends on which of the conductive layer 13 or the conductive material layer 15 is in direct contact with the buffer layer 12. Therefore, the interlayer 21 may be only composite conductive layer 16, or further comprises the conductive material layer 15 as required. The formed composite conductive layer 16 may be comprised of metal silicide, such as those having stable physical and chemical properties and low resistance. If the conductive layer 13 and the conductive material layer 15 comprise tungsten or titanium, the composite conductive layer 16 may be metal silicide of tungsten or titanium, for example, tungsten silicide or titanium silicide.

Figure 8:
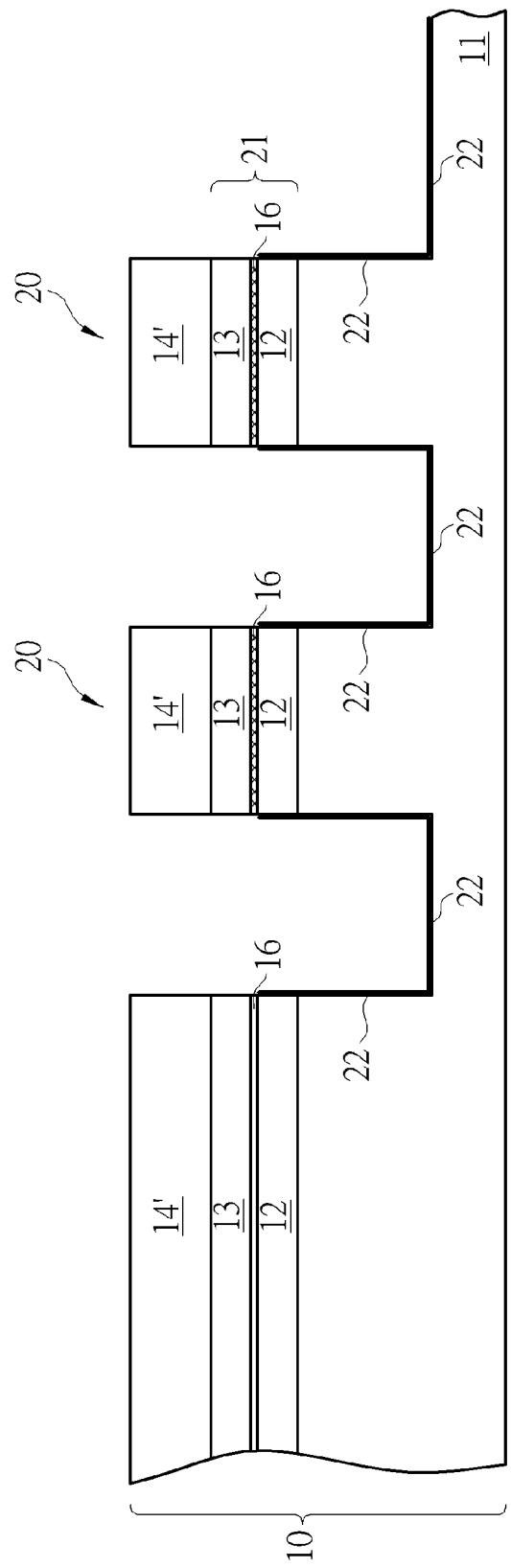
Figure 8A:
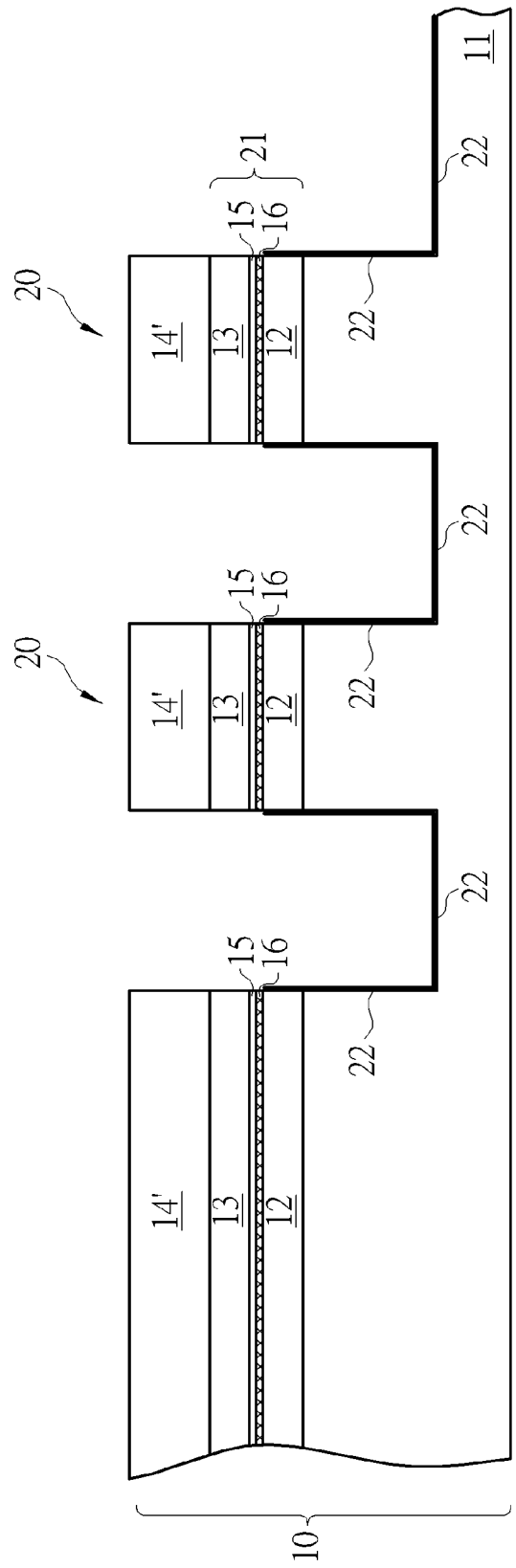

According to another embodiment of the invention, the method for forming the contact node of the vertical transistor structure further comprises forming gate oxide layer that is required in the vertical transistor structure. For example, referring to FIG. 8 and FIG. 8A, the exposed protruding structures 20 are subjected to an oxidation process. When the surfaces of the exposed protruding structures 20 contain silicon, for example, the substrate 11 and the buffer layer 12, gate oxide layer 22 is formed on the surfaces of the exposed protruding structures 20 after oxidation. The aforesaid oxidation process may be in-situ steam growth (ISSG) process. The gate oxide layer 22 may have an effective oxide thickness of 1 nm to 20 nm.

Figure 9:
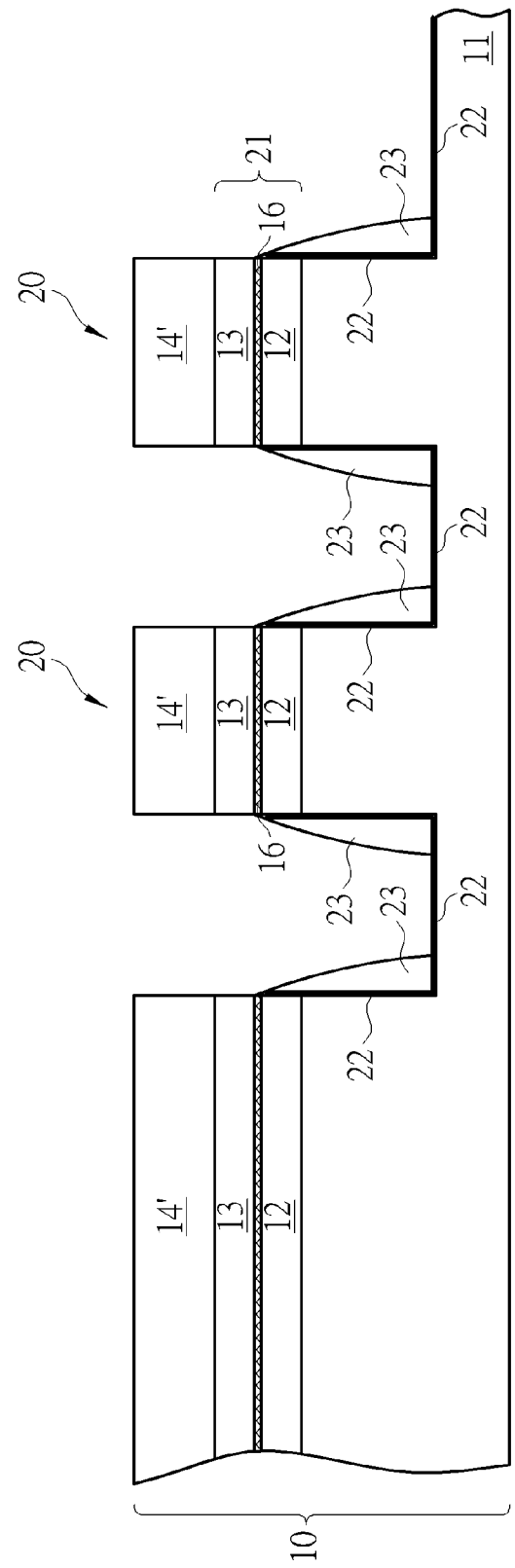
Figure 9A:
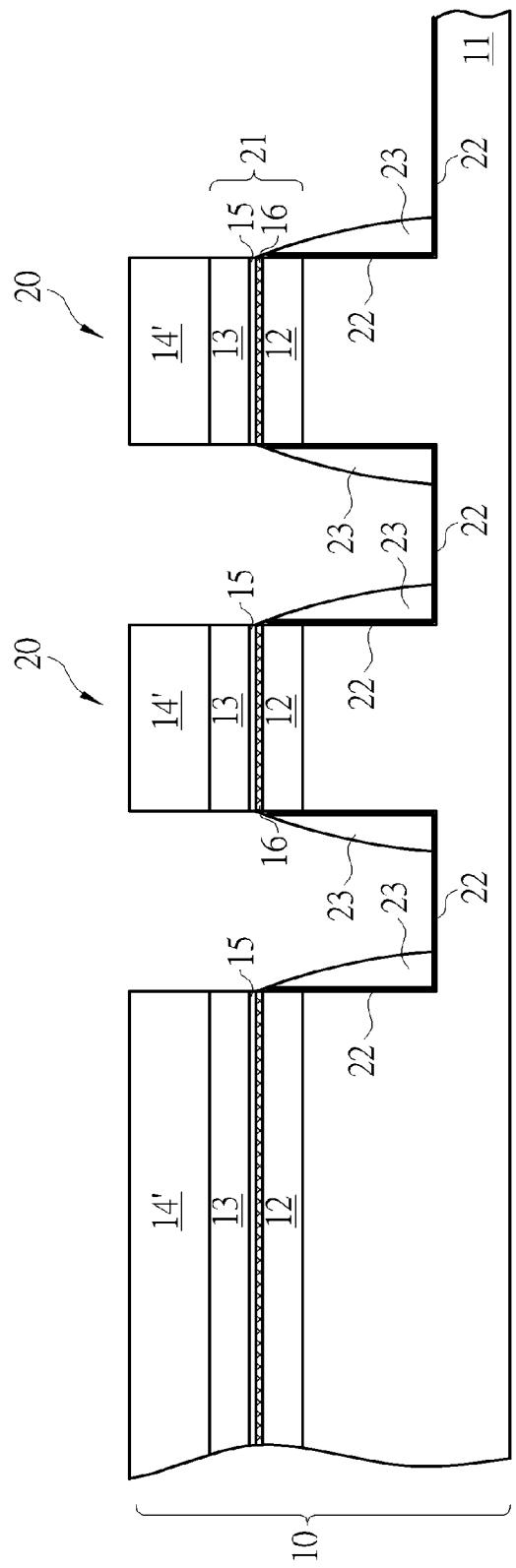
Figure 9B:
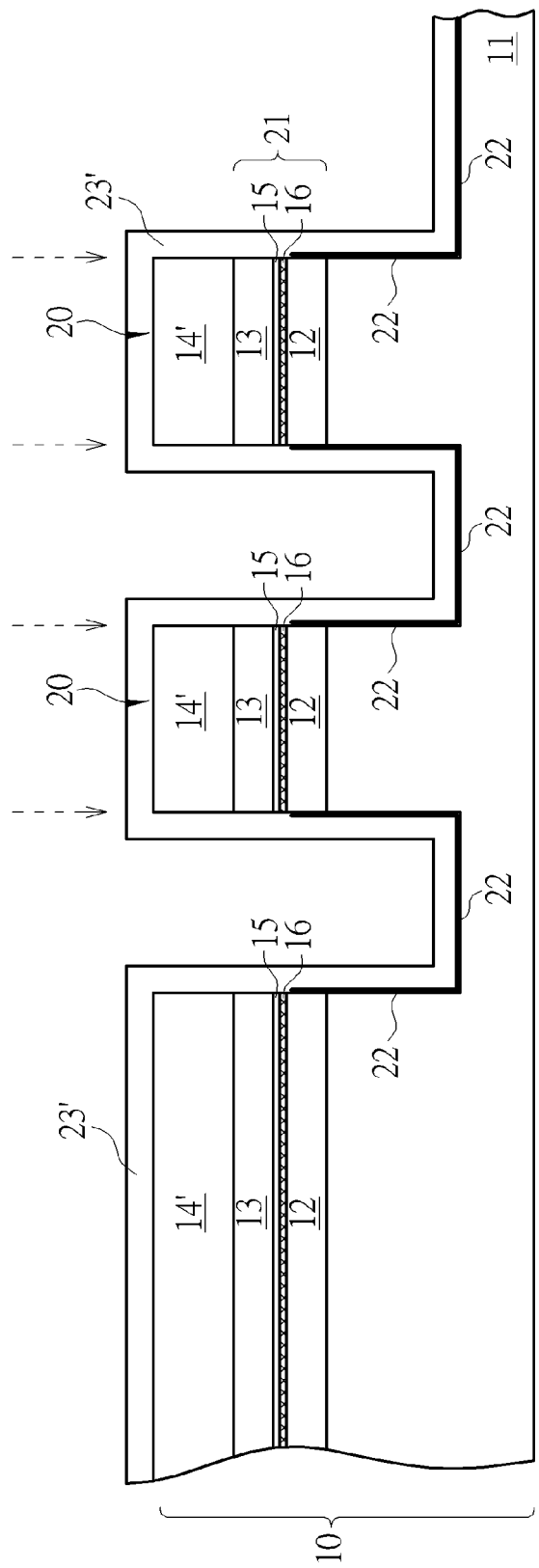

According to another embodiment of the invention, the method for forming the contact node of the vertical transistor structure further comprises forming a spacer surrounding the vertical transistor structure. For example, referring to FIG. 9 and FIG. 9A, after forming the gate oxide layer 22, a spacer is formed on the surface of each the protruding structures 20 to protect the gate oxide layer 22. As shown in FIG. 9B, to form the spacer 23, one-layer or multi-layer spacer material film 23' is conformally formed on the surface of each of the protruding structures 20. The spacer material film 23' may be comprised of a dielectric material, for example, silicon nitride, silicon oxide, or a combination thereof. Subsequently, as shown in FIG. 9 and FIG. 9A, a selective etching process is performed to remove portions of the spacer material film 23', for example, the horizontal portions thereof, thereby transforming the spacer material film 23' into spacer 23 that can be used to protect the gate oxide layer 22 on the surface of each of the protruding structures 20.

Figure 10:
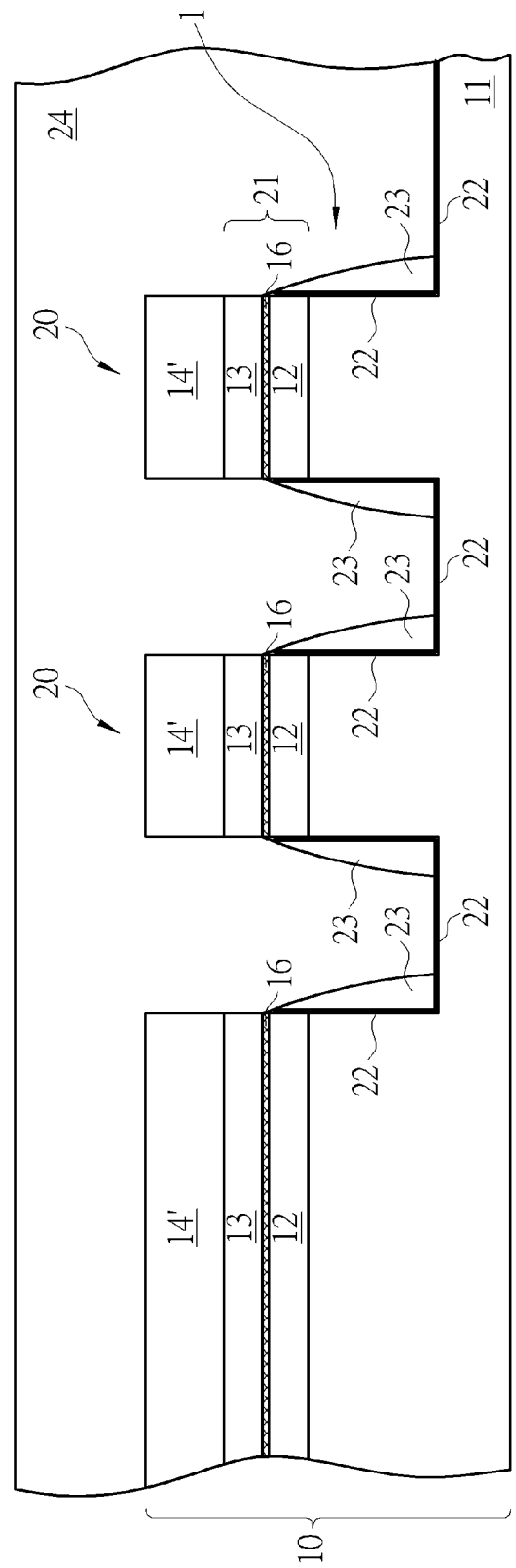
Figure 10A:
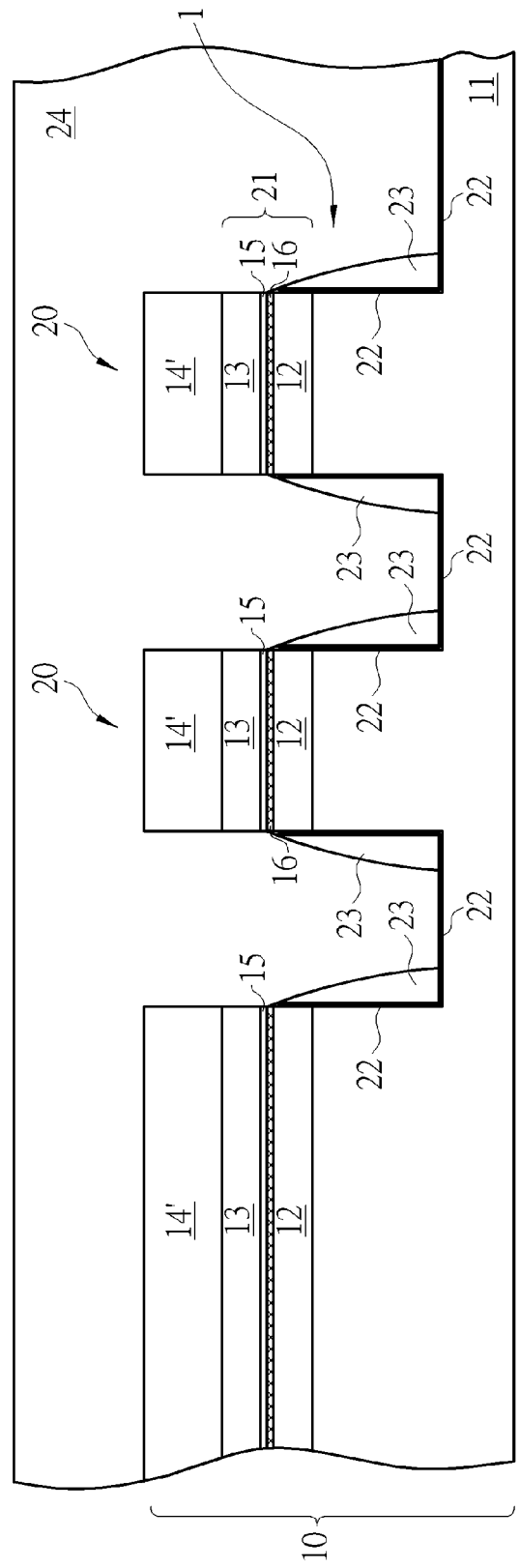

Please refer to FIG. 10 and FIG. 10A, according to another embodiment of the invention, the method for forming the contact node of the vertical transistor structure further comprises forming a dielectric layer 24 to cover the protruding structures 20. For example, as shown in FIG. 9 and FIG. 9A, after the formation of the spacer 23, a dielectric layer 24 is formed to cover the protruding structures 20 having thereon the gate oxide layer 22 and the spacer 23. Each of the protruding structures 20 having thereon the gate oxide layer 22 and the spacer 23 becomes independent and isolated vertical transistor 1 due to the isolation of the dielectric layer 24.

Figure 11:
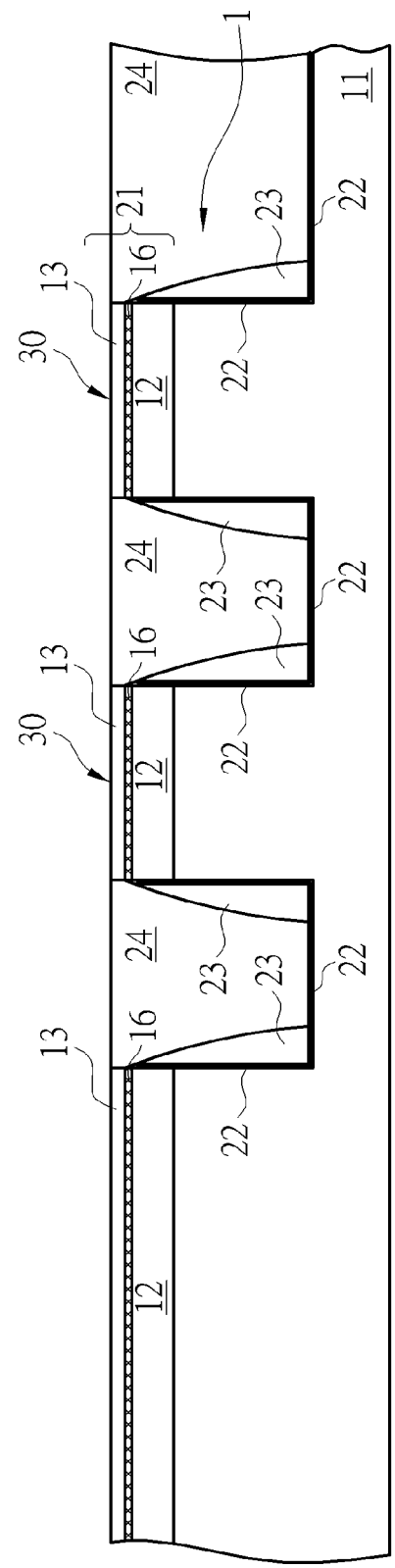
FIG. 11 and FIG. 11A illustrate a preferred process for forming contact node of the vertical transistor structure according to the invention.
Figure 11A:
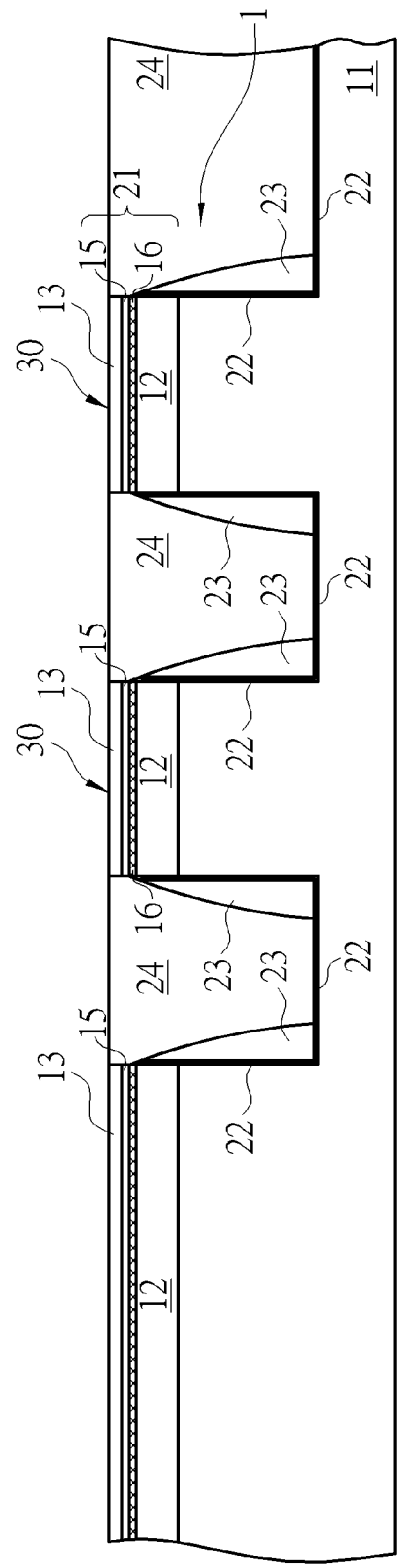

According to another embodiment of the invention, referring to FIG. 11 and FIG. 11A, after the formation of the vertical transistor structure 1, the method further comprises the step of forming a contact node of the vertical transistor structure 1. For example, after forming the dielectric layer 24 to cover the protruding structures 20 with gate oxide layer 22 and spacer 23, the dielectric layer 24 is partially removed, while trying to remove the conductive layer 13 or conductive material layer 15 that is in direct contact with the composite conductive layer 16. Chemical mechanical polishing (CMP) may be used, using the material layer above the composite conductive layer 16 as the polishing stop layer, such that the polishing stops at the bottom of the material layer above the composite conductive layer 16, such as the bottom of the conductive layer 13 or conductive material layer 15. In this way, the conductive layer 13 or the conductive material layer 15 can be removed as much as possible to reduce the vertical height of the vertical transistor structure 1, while the underlying composite conductive layer 16 is not exposed.

The present invention vertical transistor structure is now complete, with very low contact resistance node 30 (composite conductive layer 16 protected by a very thin upper layer) as an electrical connection between the vertical transistor structure 1 and a stacked capacitor (not shown). Because of this the contact node 30 having the desired physical properties of low contact resistance and is stable, it can effectively improve the performance of dynamic random access memory.

Figure 12:
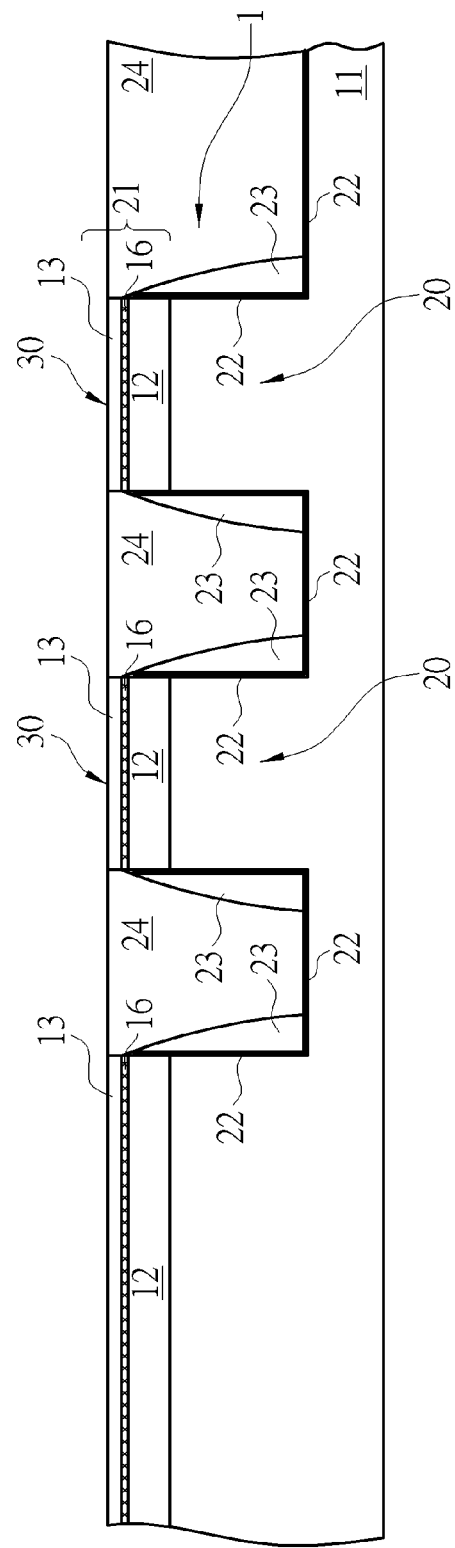
FIG. 12 and FIG. 12A illustrate one preferred embodiment of vertical transistor structure with contact node according to the invention.
Figure 12A:
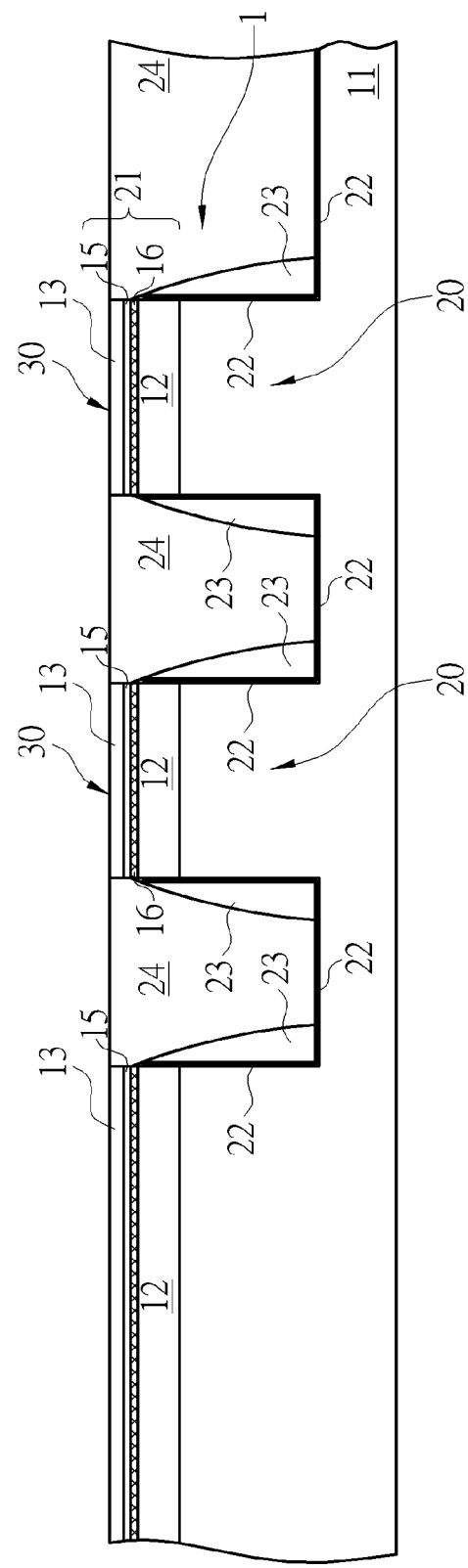

After the above steps, the present invention can be obtained in another aspect provided by, a vertical transistor structure with a very low resistance contact node. FIG. 12 and FIG. 12A respectively illustrate different embodiments of the invention vertical transistor structure with low resistance contact node 30. As depicted in FIG. 12, the present invention discloses a vertical transistor structure 1 with ultra-low ohmic contact node 30, comprising a substrate 11, a buffer layer 12, a conductive layer 13, a composite conductive layer 16, an interlayer 21, a gate oxide layer 22, and spacer 23. The substrate 11 has protruding structures 20, and the buffer layer 12 covers the top surface of the protruding structures 20. The protruding structure is a cubic shaped structure, for example, an island-like pillar and disconnected from one another. The conductive layer 13 is located on the buffer layer 12. The interlayer 21 is interposed between the buffer layer 12 and the conductive layer 13, which is a composite conductive layer 16 formed by reacting the conductive layer 13 with the buffer layer 12. In particular, the interlayer 21 is used as a contact node 30 of the vertical transistor structures 1. The dielectric layer 24 is located between the vertical transistor structures 1 for insulating purposes between the vertical transistor structures 1.

As shown in FIG. 12 and FIG. 12A, the present invention discloses an extremely low resistance contact node 30 of vertical transistor structure 1. The vertical transistor structure 1 may comprise a substrate 11, a buffer layer 12, a conductive layer 13, a conductive material layer 15, a composite conductive layer 16, an interlayer 21, a gate oxide layer 22, and spacer 23. The substrate 11 has protruding structures 20, and the buffer layer 12 covers the top surface of the protruding structures 20. The protruding structure is a cubic shaped structure, for example, an island-like pillar and disconnected from one another. The conductive layer 13 is located on the buffer layer 12. The conductive layer 13 is located on the conductive material layer 15 such that the interlayer 21 comprising the conductive material layer 15 and the composite conductive layer 16 is interposed between the buffer layer 12 and the conductive layer 13. The composite conductive layer 16 is formed by reacting the conductive layer 13 with the buffer layer 12. In particular, the interlayer 21 and the conductive layer 13 are used as a contact node 30 of the vertical transistor structures 1. The dielectric layer 24 is located between the vertical transistor structures 1 for insulating purposes between the vertical transistor structures 1.

The substrate 11 is typically a semiconductor material such as silicon. Depending on the design requirements, typically, the substrate 11 is appropriately doped with, for example, P-type or N-type dopants. The buffer layer 12 may be a semiconductor material such as deposited silicon layer (deposited Si), which is located between the substrate 11 and the conductive layer 13. The buffer layer 12 is used as a buffer between the substrate 11 and the adjacent conductive layer 13. The conductive layer 13 is typically a metallic material, preferably those capable of forming a metal silicide with silicon to have stable physical and chemical properties and low resistance, such as tungsten or titanium. The conductive material layer 15 as required may be of another metal materials, preferably those capable of forming a metal silicide with silicon to have stable physical and chemical properties and low resistance, such as tungsten or titanium. It noteworthy that the conductive layer 13 and the conductive material layer 15 are mutually different.

The material layer interposed between the buffer layer 12 and the conductive layer 13 is interlayer 21. The composite conductive layer 16 may be comprised of metal silicide, such as those having stable physical and chemical properties and low resistance. If the conductive layer 13 and the conductive material layer 15 comprise tungsten or titanium, the composite conductive layer 16 may be metal silicide of tungsten or titanium, for example, tungsten silicide or titanium silicide. In addition, the vertical transistor structure 1 also includes the gate oxide layer 22 on the surface of the protruding structure 20, and the spacer 23 around the protruding structure 20, used to protect the gate oxide layer 22. The gate oxide layer 22 may have an effective oxide thickness of 1 nm-20 nm. As shown, the spacer 23 and the gate oxide layer 22 are buried in the dielectric layer 24.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A vertical transistor structure, comprising:
   a substrate having a protruding structure;
   an offset layer covering a top surface of the protruding structure; and
   an interlayer on the offset layer, wherein the interlayer comprises a composite conductive layer formed from the offset layer and functions as a contact node of the vertical transistor structure, wherein the protruding structure is a cubic shaped structure.

2. The vertical transistor structure according to claim 1 wherein the substrate is a doped silicon substrate.

3. The vertical transistor structure according to claim 1 wherein the protruding structure is an island-like pillar.

4. The vertical transistor structure according to claim 1 wherein the offset layer is a deposited silicon layer.

5. The vertical transistor structure according to claim 1 further comprising a conductive layer atop the offset layer, wherein the conductive layer comprises tungsten or titanium.

6. The vertical transistor structure according to claim 5 wherein the composite conductive layer is a metal silicide between the offset layer and the conductive layer.

7. The vertical transistor structure according to claim 6 wherein the composite conductive layer comprises tungsten silicide.

8. The vertical transistor structure according to claim 1 wherein the interlayer comprises a conductive material layer.

9. The vertical transistor structure according to claim 8 wherein the conductive material layer comprises tungsten or titanium, wherein the composite conductive layer is a metal silicide between the offset layer and the conductive layer.

10. A method for fabricating a contact node of a vertical transistor structure, comprising:
    providing a stack material layer comprising a hard mask layer, an offset layer, and a conductive layer;
    patterning the hard mask layer to form an etch hard mask;
    etching the stack material layer not covered by the etch hard mask to form a protruding structure; and
    subjecting the stack material layer to an annealing process thereby forming an interlayer comprising a composite conductive layer, wherein the stack material layer comprises, in the order of, the hard mask layer, the conductive layer, and the offset layer, wherein the offset layer and the conductive layer react together to form the composite conductive layer.

11. The method according to claim 10 wherein the stack material layer further comprises a substrate and a conductive material layer, wherein the offset layer covers the substrate, and wherein the offset layer and the conductive layer react together to form the composite conductive layer.

12. The method according to claim 10 wherein the offset layer is a deposited silicon layer.

13. The method according to claim 10 wherein the conductive layer comprises tungsten or titanium.

14. The method according to claim 10 wherein the composite conductive layer is a metal silicide layer.

15. The method according to claim 10 wherein the interlayer further comprises a conductive material layer.

16. The method according to claim 10 wherein the conductive material layer comprises tungsten or titanium.

17. The method according to claim 10 further comprising:
    performing an oxidation process to form a gate oxide layer on surfaces of the protruding structure.

18. The method according to claim 17 further comprising:
    forming a spacer on surfaces of the protruding structure.

19. The method according to claim 18 further comprising:
    forming a dielectric layer to cover the protruding structure; and
    partially removing the dielectric layer, and removing the conductive layer without exposing underlying said interlayer.

* * * * *